United States Patent
Kuo et al.

(10) Patent No.: US 10,859,630 B2
(45) Date of Patent: Dec. 8, 2020

(54) TEST METHODS FOR PACKAGED INTEGRATED CIRCUITS

(71) Applicant: Silicon Motion, Inc., Jhubei (TW)

(72) Inventors: Hung-Sen Kuo, Zhubei (TW); Te-Wei Chen, Zhubei (TW); Hung-Sheng Chang, Hsinchu (TW); Ming-Wan Kuan, Toufen (TW)

(73) Assignee: SILICON MOTION, INC., Jhubei (TW)

( * ) Notice: Subject to any disclaimer, the term of this patent is extended or adjusted under 35 U.S.C. 154(b) by 155 days.

(21) Appl. No.: 15/813,553

(22) Filed: Nov. 15, 2017

(65) Prior Publication Data

US 2018/0259580 A1 Sep. 13, 2018

(30) Foreign Application Priority Data

Mar. 7, 2017 (TW) .............................. 106107359 A

(51) Int. Cl.
  *G01R 31/319* (2006.01)
  *G01R 31/3183* (2006.01)
  *G01R 31/28* (2006.01)
  *G01R 31/30* (2006.01)
  *G01R 31/3177* (2006.01)

(52) U.S. Cl.
  CPC ... *G01R 31/31924* (2013.01); *G01R 31/2879* (2013.01); *G01R 31/3177* (2013.01); *G01R 31/318314* (2013.01); *G01R 31/3008* (2013.01)

(58) Field of Classification Search
  CPC .......... G01R 31/31924; G01R 31/2879; G01R 31/3177; G01R 31/318314; G01R 31/3008
  See application file for complete search history.

(56) References Cited

U.S. PATENT DOCUMENTS

| 5,180,967 | A | 1/1993 | Yamazaki | |
|---|---|---|---|---|
| 6,255,842 | B1* | 7/2001 | Hashimoto | G01R 31/2851 323/316 |
| 6,313,690 | B1* | 11/2001 | Ohshima | H03K 17/0822 323/283 |

(Continued)

FOREIGN PATENT DOCUMENTS

| CN | 101680921 A | 3/2010 |
|---|---|---|
| CN | 102226831 A | 10/2011 |

(Continued)

OTHER PUBLICATIONS

Chinese Office Action dated Dec. 27, 2019 in Chinese application 106107359.

(Continued)

*Primary Examiner* — Tung X Nguyen
*Assistant Examiner* — Feba Pothen
(74) *Attorney, Agent, or Firm* — McClure, Qualey & Rodack, LLP

(57) ABSTRACT

A circuit test method for a test device to test a device under test is provided. The circuit test method includes the steps of applying zero volts to a plurality of power pins of the device under test; applying a test voltage to a first signal pin among a plurality of signal pins of the device under test; and measuring a current on a second signal pin among the plurality of signal pins of the device under test and determining whether there is a leakage current in the device under test.

17 Claims, 3 Drawing Sheets

(56) References Cited

U.S. PATENT DOCUMENTS

| | | |
|---|---|---|
| 7,940,058 B2 | 5/2011 | Newton et al. |
| 9,933,475 B2 | 4/2018 | Uematsu et al. |
| 2002/0036513 A1* | 3/2002 | Hashimoto ...... G01R 31/31917 324/750.01 |
| 2005/0017745 A1* | 1/2005 | Ito ........................ G01R 31/002 324/756.04 |
| 2006/0012391 A1 | 1/2006 | Huang |
| 2006/0238214 A1 | 10/2006 | Itoh |
| 2007/0022398 A1* | 1/2007 | Haridass ............. G06F 17/5068 716/120 |
| 2007/0201175 A1 | 8/2007 | Arai et al. |
| 2011/0187396 A1* | 8/2011 | Jarrige ............... G01R 31/3008 324/750.3 |
| 2011/0299069 A1* | 12/2011 | Jang ................... G01N 21/9501 356/237.2 |
| 2016/0216313 A1 | 7/2016 | Ogawa |

FOREIGN PATENT DOCUMENTS

| | | |
|---|---|---|
| CN | 205176156 A | 4/2016 |
| JP | H04-111008 A | 4/1992 |
| TW | 228936 | 8/1994 |
| TW | I220173 B | 8/2004 |
| TW | 201628013 A | 8/2016 |

OTHER PUBLICATIONS

Search report accompanying the Office Action dated Dec. 27, 2019 in Chinese application 106107359.

* cited by examiner

TEST METHODS FOR PACKAGED INTEGRATED CIRCUITS

CROSS REFERENCE TO RELATED APPLICATIONS

This Application claims priority of Taiwan Patent Application No. 106107359, filed on Mar. 7, 2017, the entirety of which is incorporated by reference herein.

BACKGROUND OF THE INVENTION

Field of the Invention

The invention relates to a circuit test method, and more particularly, to a test method for a packaged integrated circuit.

Description of the Related Art

As operation speeds of integrated circuits get faster and faster and the structures thereof become more complex, the number of input/output pins increases, which results in path complexity of the integrated circuits also increasing. To deal with the increased path complexity, test modes are usually applied to dies, and the circuits of the dies can be tested before the packaging processes, thereby preventing failure due to shorting on the paths and other mistakes.

Moreover, due to the increased complexity of integrated circuits and limitations in areas of the products, several dies may be stacked during the packaging process to decrease the area of the integrated circuit and enhance the performance of the integrated circuit. However, after dies are packaged or stacked, their own test modes are not performed to find errors on other paths which may be induced during the stacking and packaging processes.

Thus, it is important to provide a test mode for products which can be performed after dies are packaged or stacked.

BRIEF SUMMARY OF THE INVENTION

The present invention provides a test method which can measure a leakage current on a signal pin when an integrated circuit is not activated yet.

One exemplary embodiment of a circuit test method for a test device to test a device under test is provided. The circuit test method comprises the steps of coupling a plurality of power pins of the device under test to a ground; applying a test voltage to a first signal pin among a plurality of signal pins of the device under test; and measuring a current on a second signal pin among the plurality of signal pins of the device under test and determining whether there is a leakage current in the device under test.

Another exemplary embodiment of a circuit test method for a test device to test a device under test is provided. The circuit test method comprises the steps of applying zero volts to a plurality of power pins of the device under test; applying a test voltage to a first signal pin among a plurality of signal pins of the device under test; and measuring a current on a second signal pin among the plurality of signal pins of the device under test and determining whether there is a leakage current in the device under test.

Another exemplary embodiment of a circuit test method for a test device to test a device under test is provided. The circuit test method comprises the steps of performing a measurement operation on a plurality of signal pins of the device under test when all elements in the device under test are not activated; and determining whether there is a leakage current in the device under test according to a measurement result.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
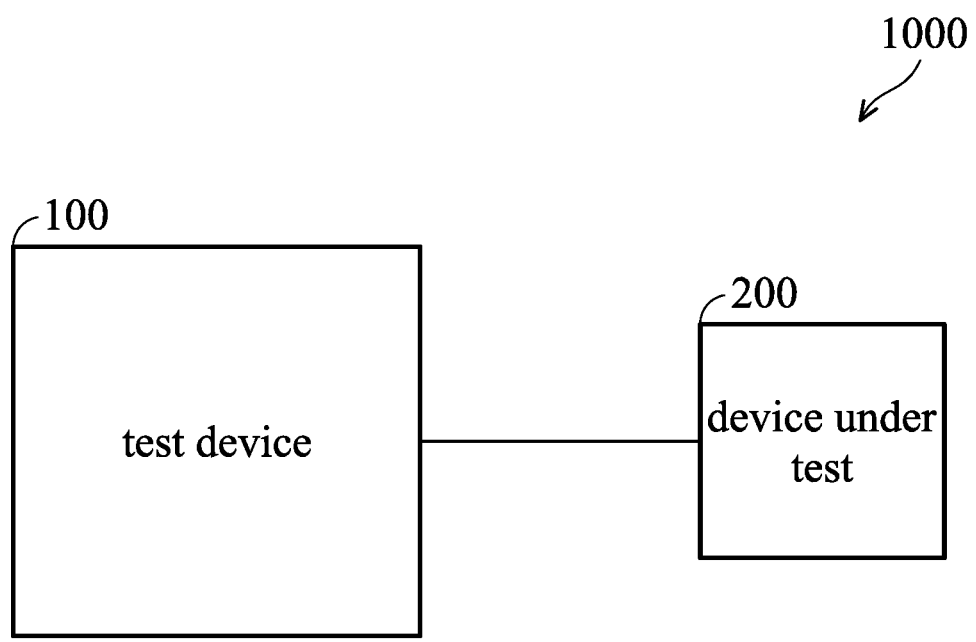
FIG. 1 shows a block diagram of an exemplary embodiment of a test system.

FIG. 1 shows a block diagram of an exemplary embodiment of a test system. The test system 1000 comprises a test device 100 and a device 200 under test. The device 200 under test is an integrated circuit (chip) which has been packaged. The device 200 under test comprises a plurality of pins. The type of pins of the device 200 under test correspond to the type of package of the device 200 under test, such as a ball grid array (BGA) package, a quad flat package (QFP), a small outline package (SOP), a dual in-line package (DIP), and so on. The test device 100 is coupled to the pins of the device 200 under test through probes or circuit boards for performing a test process on the device 200 under test. In an embodiment, the test device 100 may comprise a controller which is capable of being coupled to a plurality of probes through a communication cable to apply voltages and measure signals to the device 200 under test. The probes may be, for example, elastic spring probes, pogo pins, cobra-type probes, conductive bumps, or any probes which can make contact with the pins of the device 200 under test. In another embodiment, the pins of the device 200 under test can be coupled to contact pads on a circuit board, and the controller of the test device 100 can be coupled to the circuit board through a communication cable, thereby applying voltages and measuring signals to the device 200 under test through the circuit board.

Generally, the device 200 under test may comprise a plurality of power pins, a plurality of ground pins, and a plurality of signal pins. The power pins are used to lead an operation voltage into the device 200 under test to activate the chips in the device 200 under test. The ground pins are coupled to the ground to provide voltage differences of the chips in the device 200 under test and discharging paths. The signal pins are used to input signals to the chips in the device 200 under test or output signals generated by the chips in the device 200 under test.

In an embodiment, the test device 100 applies a voltage to the power pins of the device 200 under test to activate the device 200 under test, so that the activated device 200 under test then enters a test mode to be tested. The applied voltage required to activate the device 200 under test is 3.3 volts or 5 volts, however, the invention is not limited thereto. In the test mode, the signal pins of the device 200 under test have a high impedance or state at the tri-state level. When the device 200 under test operates in the test mode, the test device 100 performs a measurement operation on the signal pins of the device 200 under test to determine whether an input high leakage (IIH) or an input low leakage (IIL) occur. However, in some embodiments, the above measurement method cannot measure leakage currents on certain paths in the device 200 under test, specifically, when the device 200 under test comprises a plurality of stacked dies.

Figure 2:
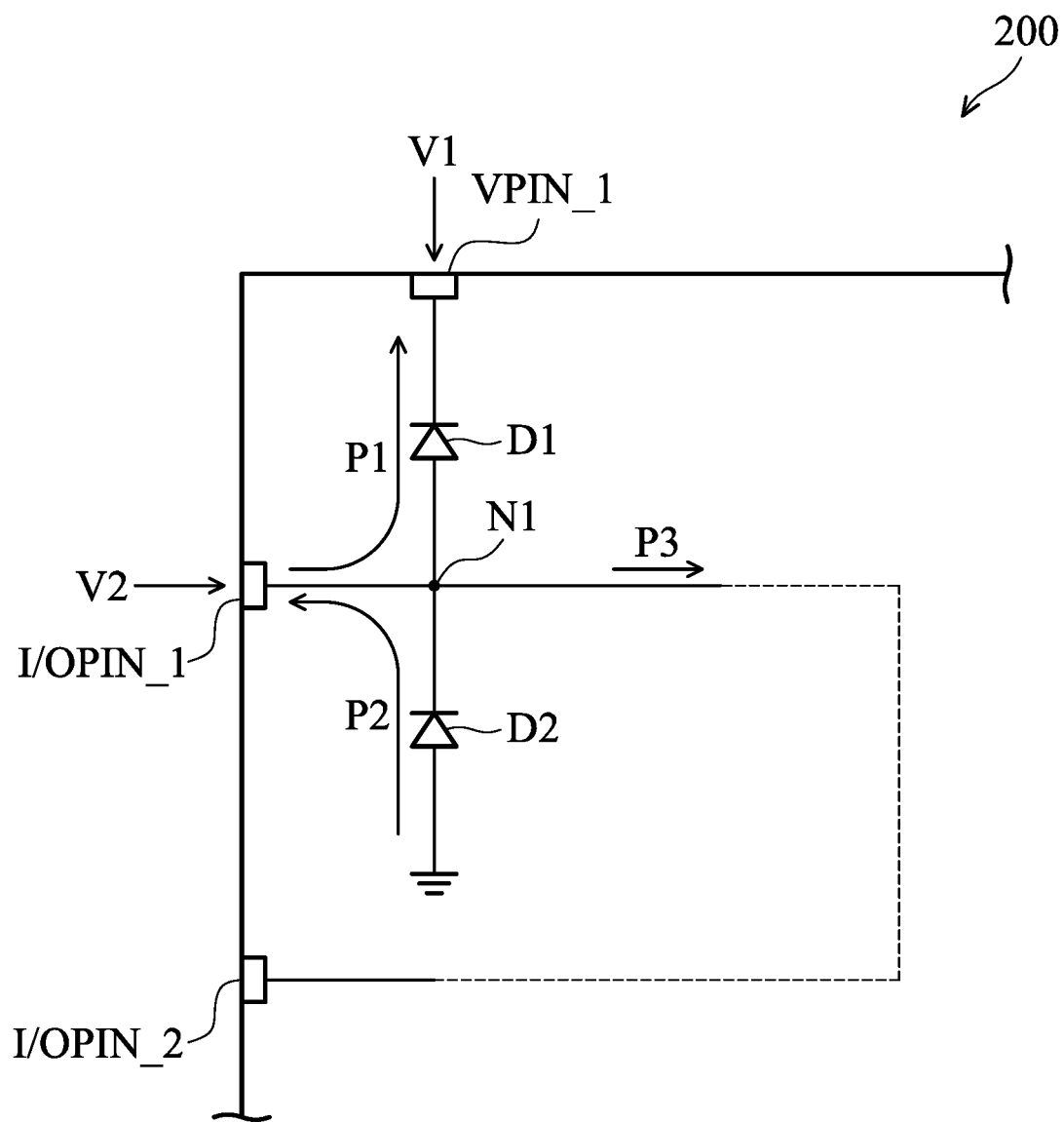
FIG. 2 shows an exemplary embodiment of a device under test.

An example will be described by referring to FIG. 2, which shows an exemplary embodiment of a device under test. In FIG. 2, part of the device 200 under test comprises a power pin VPIN_1, a signal pin I/OPIN_1, and diodes D1 and D2. In the embodiment, the anode of the diode D1 is coupled to the signal pin I/OPIN_1, the cathode of the diode D2, and other circuits through a node N1. The cathode of the diode D1 is coupled to the power pin VPIN_1. The anode of the diode D2 is coupled to the ground. The cathode of the diode D2 is coupled to the anode of the diode D1, the signal pin I/OPIN_1, and other circuits through the node N1. Moreover, the node is coupled to another signal pin I/OPIN_2 through a path P3, however, the invention is not limited thereto. During the test process, the test device 100 applies a voltage V1 which is larger than zero volts (such as 3.3 volts) to the power pin VPIN_1 first and also transmits a signal through a certain signal pin to make the device 200 under test enter the test mode. In the test mode, the test device 100 applies two voltages V2 to the signal pin I/OPIN_1 for determining whether there is a leakage current on the path of the signal pin I/OPIN_1. First, the test device 100 applies a low voltage (such as zero volts) to the signal pin I/OPIN_1 to measure an input low leakage (IIL). In an ideal state, since the voltage of the power pin VPIN_1 is higher than the voltage of the signal pin I/OPIN_1, the diode D1 is not turned on due to a reverse-bias state, so that no current is generated on the path P1. Moreover, since there is no voltage difference between the voltage of the signal pin I/OPIN_1 and the voltage of the ground, the diode D2 is not turned on either, so that there is no current on the path P2. Thus, in cases where the test device 100 measures a current on the signal pin I/OPIN_1, this indicates that a leakage current (the input low leakage) is generated on the path P1 and/or the path P2. Then, the test device 100 applies a high voltage which is the same as the operation voltage V1 (such as 3.3 volt) to the signal pin I/OPIN_1 to measure the input high leakage (IIH). In an ideal state, since there is no voltage difference between the voltage of the power pin VPIN_1 and the voltage of the signal pin I/OPIN_1, the diode D1 is not turned on either, so that there is no current on the path P1. Moreover, the voltage of the power pin VPIN_1 is higher than the voltage of the ground, and the diode D2 is not turned on due to a reverse-bias state, so that no current is generated on the path P2. Thus, in cases where the test device 100 measures a current on the signal pin I/OPIN_1, this indicates that a leakage current (the input high leakage) is generated on the path P1 and/or the path P2. In the above test method, whether the diode D1 and the diode D2 are turned on is determined according to the bias states of the diode D1 and D2. However, if there is a leakage current on the path P3, the test device 100 cannot discover this situation according to the above test mode.

Thus, another exemplary embodiment of a test method is provided to overcome the above situation. In the embodiment, the test device 100 measures the signal pins of the device 200 under test when all elements in the device 200 under test are not activated and further determines whether there is a leakage current in the device 200 under test; in other words, during the test process, all dies and all elements in the device 200 under test are not activated. Specifically, the power pins of all dies in the device 200 under test are coupled to the ground or supplied with a voltage of zero volts. Thus, the power pins of the device 200 under test are not floating. It is worth noting that, in other embodiments, the power pins which do not affect the measurement results can be supplied with other voltages, however, the invention is not limited thereto.

The device 200 under test shown in FIG. 2 is used as an example for illustration. During the test process, the test device 100 couples the power pin VPIN_1 of the device 200 under test to a ground or applies zero volts (V1) to the power pin VPIN_1 of the device 200 under test. Then, the test device 100 applies a test voltage (V2) to the signal pin I/OPIN_1 of the device 200 under test. It is worth noting that the test voltage is a very low voltage. Specifically, the test voltage has to be lower than a predetermined value so that the diode D1 is not turned on. For example, the predetermined value is 0.6 volts, and the test voltage can be 0.1 volts, 0.4 volts, 0.5 volts, or 0.6 volts, however, the invention is not limited thereto. Since the voltage on the power pin VPIN_1 of the device 200 under test is zero volts and the test voltage is lower than the predetermined value, all dies and all elements in the device 200 under test are not activated. In a state where all dies and all elements in the device 200 under test are not activated, there is no current larger than another predetermined value on any path of the device 200 under test. When the test device measures a current that is larger than the predetermined value on any signal pin of the device 200 under test, the test device 100 determines that there is a leakage current in the device 200 under test. In the embodiment, when a leakage current is generated on the path P3, the test device 100 measures a current, which is larger than an predetermined value, on the signal pin I/OPIN_2, for example, the predetermined voltage is 15 μA.

Figure 3:
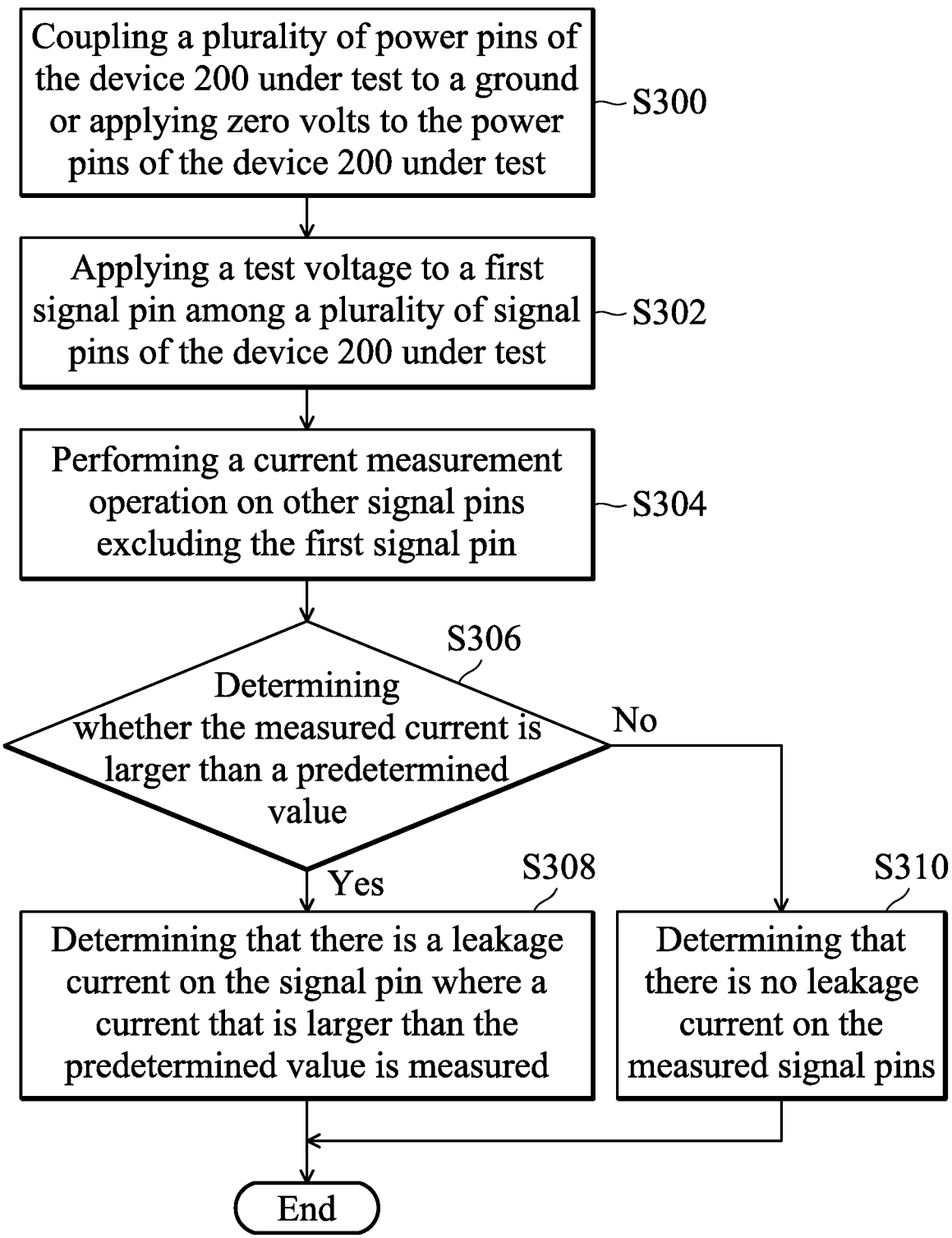
FIG. 3 shows an exemplary embodiment of a circuit test method.

FIG. 3 shows an exemplary embodiment of a circuit test method. The circuit test method is applied to the test system 1000, specifically, for the test device 100. The flow of the circuit test method starts at step S300.

In step S300, the test device 100 couples a plurality of power pins of the device 200 under test to a ground or applies zero volts to the power pins of the device 200 under test. It is worth noting that, in other embodiments, the power pins which do not affect the measurement results can be supplied with other voltages, however, the invention is not limited thereto.

Then, in step S302, the test device 100 applies a test voltage to a first signal pin among a plurality of signal pins of the device 200 under test. It is worth noting that the test voltage is a very low voltage. Specifically, the test voltage has to be lower than a predetermined value so that the diode D1 is not turned on. For example, the predetermined value is 0.6 volts, and the test voltage can be 0.1 volts, 0.4 volts, 0.5 volts, or 0.6 volts, however, the invention is not limited thereto. Since the voltage on the power pin VPIN_1 of the device 200 under test is zero volts and the test voltage is lower than the predetermined value, all dies and all elements in the device 200 under test are not activated.

In step S304, the test device 100 performs a current measurement operation on other signal pins excluding the first signal pin. In an embodiment, the test device 100 performs the current measurement operation on all signal pins excluding the first signal pin, however, the invention is not limited thereto. In other embodiments, according to the circuit design, the test device 100 performs the current measurement operation on at least one signal pin related to the path of the first signal pin.

Then, in step S306, the test device 100 determines whether the measured current is larger than a predetermined value. In an embodiment, the predetermined value is 15 µA, however, the invention is not limited thereto. When the measured current is larger than the predetermined value, the method proceeds to step SS308; otherwise, the method proceeds to step S310.

In step S308, the test device 100 determines that there is a leakage current on the signal pin where a current that is larger than the predetermined value is measured. The method ends in step S308. It is worth noting that, in some embodiments, the test device 100 may output the measurement result through an output device, such as a display, a buzzer, and so on.

In step S310, the test device 100 determines that there is no leakage current on the measured signal pins. The method ends in step S310. It is worth noting that, in some embodiments, the test device 100 may output the measurement result through an output device, such as a display, a buzzer, and so on.

The test device and the circuit test method in the above embodiments are applied to measure leakage currents on signal pins when integrated circuit, which have been packaged or stacked, are not activated yet.

Circuit test method, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit test method for a test device to test a device under test, comprising:
   coupling a plurality of power pins of the device under test to a ground such that all of elements in the device under test are not activated;
   when all of the elements in the device under test are not activated, applying a test voltage to a first signal pin among a plurality of signal pins of the device under test;
   when all of the elements in the device under test are not activated, measuring a current on a second signal pin among the plurality of signal pins of the device under test, wherein the second signal pin is coupled to the first signal pin; and
   determining whether there is a leakage current in the device under test according to the measured current.

2. The circuit test method as claimed in claim 1, wherein the device under test is an integrated circuit which has been packaged.

3. The circuit test method as claimed in claim 1, wherein the test voltage is smaller than a predetermined value.

4. The circuit test method as claimed in claim 3, wherein the predetermined value is 0.6 volts.

5. A circuit test method for a test device to test a device under test, comprising:
   applying zero volts to a plurality of power pins of the device under test such that all of elements in the device under test are not activated;
   when all of the elements in the device under test are not activated, applying a test voltage to a first signal pin among a plurality of signal pins of the device under test;
   when all of the elements in the device under test are not activated, measuring a current on a second signal pin among the plurality of signal pins of the device under test, wherein the second signal pin is coupled to the first signal pin; and
   determining whether there is a leakage current in the device under test according to the measured current.

6. The circuit test method as claimed in claim 5, wherein the device under test is an integrated circuit which has been packaged.

7. The circuit test method as claimed in claim 5, wherein the test voltage is smaller than a predetermined value.

8. The circuit test method as claimed in claim 7, wherein the predetermined value is 0.6 volts.

9. A circuit test method for a test device to test a device under test, comprising:
   coupling a diode between a first signal pin among a plurality of signal pins of the device under test and a first power pin among a plurality of power pins of the device under test, wherein an anode of the diode is coupled to the first signal pin, and a cathode of the diode is coupled to the first power pin;
   when all of elements in the device under test are not activated, applying a test voltage on the first signal pin, wherein the test voltage is lower than a predetermined value so that the diode is not turned on;
   when all of the elements in the device under test are not activated, measuring a current on a second signal pin among the plurality of signal pins of the device under test, wherein the second signal pin is coupled to the first signal pin; and
   determining whether there is a leakage current in the device under test according to the measured current.

10. The circuit test method as claimed in claim 9, wherein the device under test comprises a plurality of dies, and all of the pluralty of dies are not activated during the measurement process on the device under test.

11. The circuit test method as claimed in claim 10, wherein the plurality of power pins are coupled to a ground.

12. The circuit test method as claimed in claim 10, wherein the plurality of power pins are supplied with zero volts.

13. The circuit test method as claimed in claim 9, wherein the test voltage is 0.1 volts, 0.4 volts, 0.5 volts or 0.6 volts.

14. The circuit test method as claimed in claim 9, wherein the device under test is an integrated circuit which has been packaged.

15. The circuit test method as claimed in claim 1, further comprising:
   coupling a diode between the first signal pin and a first power pin among the plurality of power pins, wherein an anode of the diode is coupled to the first signal pin, and a cathode of the diode is coupled to the first power pin,
   wherein the test voltage is lower than a predetermined value so that the diode is not turned on.

16. The circuit test method as claimed in claim 5, further comprising:
   coupling a diode between the first signal pin and a first power pin among the plurality of power pins, wherein an anode of the diode is coupled to the first signal pin, and a cathode of the diode is coupled to the first power pin,
   wherein the test voltage is lower than a predetermined value so that the diode is not turned on.

17. The circuit test method as claimed in claim 9, wherein the diode is disposed in the device under test, the anode of the diode is directly connected to the first signal pin, and the cathode of the diode is directly connected to the first power pin.

* * * * *